United States Patent
Kamisuki et al.

(10) Patent No.: US 6,436,361 B1
(45) Date of Patent: Aug. 20, 2002

(54) SILICON CARBIDE AND PROCESS FOR ITS PRODUCTION

(75) Inventors: Youichi Kamisuki; Naomichi Miyakawa; Shinya Kikugawa, all of Kanagawa; Katsuyoshi Suzuki; Satohiro Enomoto, both of Hyogo, all of (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 09/629,826

(22) Filed: Jul. 31, 2000

(30) Foreign Application Priority Data

Jul. 30, 1999 (JP) ............................................. 11-217924

(51) Int. Cl.$^7$ .......................... C01B 31/36; C23C 16/00
(52) U.S. Cl. ....................... 423/345; 423/346; 427/589; 427/585
(58) Field of Search ............................... 423/345, 346; 427/585, 589

(56) References Cited

U.S. PATENT DOCUMENTS

| 4,668,452 A | * | 5/1987 | Watanabe et al. | ............. 264/63 |
|---|---|---|---|---|
| 5,093,039 A | * | 3/1992 | Kijima et al. | ................ 252/516 |
| 5,374,412 A | * | 12/1994 | Pickering et al. | ........... 423/346 |
| 5,904,778 A | * | 5/1999 | Lu et al. | ................. 118/723 R |
| 6,153,166 A | * | 11/2000 | Tamino | ....................... 423/345 |

FOREIGN PATENT DOCUMENTS

| EP | 582444 | 2/1994 |
|---|---|---|
| EP | 0 599 468 | 6/1994 |
| EP | 885858 | 12/1998 |

OTHER PUBLICATIONS

Derwent Publications, AN 1991–299826, JP 03 199377, Aug. 30, 1991.

* cited by examiner

*Primary Examiner*—Ngoc-Yen Nguyen
(74) *Attorney, Agent, or Firm*—Oblon, Spivak, McClelland, Maier & Neustadt, P.C.

(57) ABSTRACT

Silicon carbide having a resistivity of from $10^3$ to $10^6$ Ω·cm and a powder X-ray diffraction peak intensity ratio of at least 0.005 as represented by $I_{d1}/I_{d2}$ where $I_{d1}$ is the peak intensity in the vicinity of 2θ being 34° and $I_{d2}$ is the peak intensity in the vicinity of 2θ being 36°.

12 Claims, No Drawings ured to have high resistivities for the purpose of minimizing the
SILICON CARBIDE AND PROCESS FOR ITS PRODUCTION The present invention relates to silicon carbide having a high resistivity and a process for its production.

In recent years, along with the progress in the high densification technique and the microfabrication technique of semiconductor integrated circuits, importance of a plasma treatment apparatus such as a plasma etching apparatus or a plasma CVD apparatus has been increasing which is capable of forming a fine circuit pattern in high precision on a semiconductor wafer. Parts to be used for a plasma treatment apparatus include, for example, an electrostatic chuck, a heater, a protective ring, a sleeve and a chamber, and these parts are required to have desired resistivities and have of high purity, high corrosion resistance and uniformity. Among them, the protective ring is required to have a high resistivity for the purpose of carrying out etching uniformly within a wafer, and the sleeve and the chamber are required to have high resistivities for the purpose of minimizing the wearing rate.

Heretofore, parts made of alumina or silica have been used as parts for a plasma etching apparatus, which are required to have high resistivities. However, parts made of alumina have had a problem that high purity products are hardly obtainable, and semiconductor wafers to be treated are likely to be contaminated. Further, parts made of silica have had a problem that wearing by a plasma gas is substantial, such being disadvantageous from the viewpoint of costs. Therefore, in recent years, parts made of silicon carbide have been proposed as parts to be substituted therefor.

On the other hand, as a method for controlling the resistivity of silicon carbide ceramics, a method is known which employs e.g. beryllium, beryllium carbide, beryllium oxide or boron nitride, as a sintering aid ("Silicon Carbide Ceramics", Uchida Roukakuho, p.327). However, this method has had a problem that since another component is incorporated as a sintering aid, it is impossible to obtain highly pure silicon carbide ceramics, and when used as parts for the semiconductor production apparatus, such parts tend to contaminate semiconductor wafers.

Further, methods for controlling resistivities of silicon carbide ceramics are proposed, for example, in JP-A-52-110499, JP-A-11-79840 and JP-A-11-121311. However, the silicon carbide ceramics obtained by such methods have had problems such that the resistivities are not sufficiently high, the purities are low or the productivity is not good.

JP-A-9-255428 discloses a method for controlling the resistivity of silicon carbide ceramics, which comprises mixing α-type silicon carbide powder, β-type silicon carbide powder and super fine powder of silicon carbide, followed by sintering. However, this method has had a problem such that it is impossible to obtain a product having a large size or a complicated shape, the controllable range of the resistivity is relatively low at a level of not higher than $10^2$ Ω·cm, and it is difficult to obtain silicon carbide ceramics having high resistivities.

Further, JP-A-11-71177 discloses silicon carbide ceramics comprising silicon carbide and silica as the main components and having the resistivity controlled to be from 500 to 50,000 Ω·cm. However, such silicon carbide ceramics have a problem such that silica portions in the sintered body are likely to be selectively eroded by an acid or by a plasma gas, or the obtained sintered body has high porosity and low corrosion resistance.

Still further, JP-A-6-239609 discloses β-type silicon carbide having a resistivity of at least $10^4$ Ω·cm, which is obtainable by a CVD method. However, this β-type silicon carbide has had a problem that the resistivity fluctuates substantially, and it is difficult to obtain a product having a uniform resistivity.

It is an object of the present invention to provide silicon carbide which has a high, uniform resistivity, high purity and high corrosion resistance.

Namely, the present invention provides silicon carbide having a resistivity of from $10^3$ to $10^6$ Ω·cm and a powder X-ray diffraction peak intensity ratio of at least 0.005 as represented by $I_{d1}/I_{d2}$ where $I_{d1}$ is the peak intensity in the vicinity of 2θ being 34° and $I_{d2}$ is the peak intensity in the vicinity of 2θ being 36°.

Further, the present invention provides a process for producing such silicon carbide, which comprises forming β-type silicon carbide on a substrate by a CVD method, then removing the substrate, and heat-treating the obtained β-type silicon carbide at a temperature of from 1,500 to 2,300° C.

Now, the present invention will be described in detail with reference to the preferred embodiments.

The silicon carbide of the present invention is formed by a CVD method and has a gas-impermeable dense crystal structure, and it hence exhibits high corrosion resistance against a gas such as $CF_4$ or $CHF_3$ to be used in an etching step.

Further, the silicon carbide of the present invention is characterized in that the powder X-ray diffraction peak intensity ratio represented by $I_{d1}/I_{d2}$ where is $I_{d1}$ the peak intensity in the vicinity of 2θ being 34° and $I_{d2}$ is the peak intensity in the vicinity of 2θ being 36°, is at least 0.005.

Here, the peak in the vicinity of 2θ being 34° means the peak at 2θ being 33.2°≦2θ≦34.8°, and the peak in the vicinity of 2θ being 36° means the peak at 2θ being 35.0°≦2θ≦37.0°.

If the ratio of $I_{d1}/I_{d2}$ is smaller than 0.005, it is not possible to constantly obtain silicon carbide having a resistivity of at least $10^3$ Ω·cm. Further, if it exceeds 0.5, the effect for increasing the resistivity tends to be small. Accordingly, the ratio of $I_{d1}/I_{d2}$ is preferably from 0.005 to 0.5, more preferably from 0.007 to 0.2.

$I_{d1}$ is the intensity of a peak detected as the sum of α-type silicon carbides of 2H structure, 4H structure, 6H structure and 15R structure, and $I_{d2}$ is the intensity of a peak detected as the sum of α-type silicon carbides and β-type silicon carbides of 2H structure, 4H structure, 6H structure and 15R structure.

It is considered that the larger the ratio of $I_{d1}/I_{d2}$, i.e. the larger the proportion of α-type silicon carbides, the larger the resistivity.

In the present invention, $I_{d1}$ and $I_{d2}$ are values measured under the following conditions by means of a powder X-ray diffraction apparatus. Using CuKα-ray as the X-ray source, the accelerating voltage of the X-ray tube is set to be 40 kV, and the accelerating current is set to be 20 mA. The divergence slit (DS) is set to be 1°, the receiving slit (RS) is set to be 0.15 mm, and the scattering slit (SS) is set to be 1°. The sample to be measured is one pulverized to have a particle size of at most 20 μm, so that it is free from orientation.

Further, $I_{d1}$, and $I_{d2}$ are peak intensities obtained by smoothing treatment (an adaptive smoothing method to remove background noises, followed by smoothing by a Savitzky-Golay method), followed by removing the background by a Sonneveld method.

As the powder X-ray diffraction apparatus, GEIGER-FLEX RAD-IIA, manufactured by Rigaku Denki K.K. may, for example, be employed.

The silicon carbide of the present invention has a resistivity of from $10^3$ to $10^6$ $\Omega\cdot cm$. Silicon carbide having a ratio of $I_{d1}/I_{d2}$ of at least 0.005 and containing a certain amount of α-type silicon carbide, constantly has a resistivity within the above range.

Further, the above resistivity can be measured, for example, by a potentiometer method by means of a four-terminal resistor.

The silicon carbide of the present invention can be obtained by forming β-type silicon carbide on a substrate by a CVD method, then removing the substrate, and heat-treating the obtained β-type silicon carbide at a temperature of from 1,500 to 2,300° C.

The process for producing the silicon carbide of the present invention is characterized in that the β-type silicon carbide obtained by a CVD method, is heat-treated at a temperature of from 1,500 to 2,300° C. By carrying out the heat treatment within the above temperature range, phase transfer of the silicon carbide from β-type to α-type can be controlled, and it is possible to obtain silicon carbide having a desired resistivity and little fluctuation in the resistivity. If the temperature is lower than 1,500° C., no adequate energy tends to be given to the β-type silicon carbide, and no substantial phase transfer to α-type tends to take place, whereby it tends to be difficult to obtain silicon carbide having a desired resistivity. On the other hand, if the temperature is higher than 2,300° C., abnormal particles are likely to form during the phase transfer to α-type, whereby the strength of the obtainable silicon carbide tends to be weak. The heat treatment is particularly preferably carried out at a temperature of from 1,800 to 2,000° C.

In the present invention, the resistivity can be controlled by the heat treatment, probably by the following mechanism. Namely, by the heat treatment of the β-type silicon carbide, a part thereof undergoes modification to α-type, whereby a mixture of α-type silicon carbide particles and β-type silicon carbide particles will be obtained. Here, along the grain boundaries of the α-type silicon carbide particles and the β-type silicon carbide particles, electrical barrier walls will be formed to increase the resistivity. Accordingly, as the grain boundaries of the α-type silicon carbide particles and the β-type silicon carbide particles will increase, the resistivity will also increase.

Further, by the process of the present invention, silicon carbide having little fluctuation in the resistivity is obtainable, probably because α-type silicon carbide can be formed as uniformly dispersed by once forming only β-type silicon carbide, followed by heat treatment.

Further, the heat treatment is preferably carried out under a pressure of from 0.1 to 2.0 atms (absolute pressure, the same applies hereinafter), particularly preferably from 0.2 to 1.5 atms. By carrying out the heat treatment under such a pressure, the resistivity can constantly be controlled. If the pressure is lower than 0.1 atm, the silicon carbide tends to be readily decomposed into silicon and carbon.

The time for the heat treatment is preferably from 1 to 100 hours, particularly preferably from 5 to 10 hours. As the time for the heat treatment is long, the resistivity tends to be large. Further, after the heat treatment, the silicon carbide is preferably cooled at a rate of from 2 to 20° C./min, particularly preferably from 5 to 10° C./min. As the cooling rate is slow, the resistivity tends to be large. Thus, according to the present invention, the resistivity of the silicon carbide can be controlled by controlling not only the heating temperature but also the time for the heat treatment and the cooling rate after the heat treatment.

The heat treatment is preferably carried out in an inert atmosphere of e.g. argon or helium, or in a non-oxidizing atmosphere such as in vacuum. If the heat treatment is carried out in an oxidizing atmosphere, the silicon carbide surface will be oxidized to form silicon dioxide, and it will be necessary to remove the surface by e.g. cutting or grinding after the heat treatment.

Further, in the process of the present invention, after forming the β-type silicon carbide on the substrate by a CVD method, the substrate is removed to obtain the β-type silicon carbide.

Here, the starting material gas to form silicon carbide by the CVD method, may, for example, be a single gas such as methyltrichlorosilane or dimethyldichlorosilane or a mixed gas of silane, disilane, tetrachlorosilane or trisilane, with methane or ethane. The starting material gas is preferably introduced by using e.g. hydrogen, helium or argon as the carrier gas.

When the starting material gas is introduced as diluted by the carrier gas, it is preferred to introduce it by adjusting the molar ratio of the starting material gas to the carrier gas to be from 1:9 to 4:6.

Further, the temperature at the time of forming silicon carbide by the CVD method, is preferably from 1,000 to 1,400° C., more preferably from 1,200 to 1,350° C. If the temperature is lower than 1,000° C., the rate of formation of silicon carbide tends to be slow, and if it exceeds 1,400° C., β-type silicon carbide and α-type silicon carbide tend to be present non-uniformly, whereby the resistivity of the obtainable silicon carbide tends to be non-uniform.

As the substrate for forming silicon carbide thereon, silicon carbide, alumina or high purity carbon may, for example, be used. Among them, it is preferred to employ a substrate made of highly pure carbon having a purity of at least 99.99% from the viewpoint of the purity and efficiency in the removal of the substrate.

The silicon carbide of the present invention is preferably one having a total content of metal impurities of not more than 50 ppb. Here, metal impurities include Fe, Cu, Mg, Al, V, Ni, Na, K, Ca and Cr. If such metal impurities are included, the product tends to be an electrically conductive carrier, and the resistivity will thereby be fluctuated. Further, when the silicon carbide is used as a part for a semiconductor production apparatus, such metal impurities tend to contaminate semiconductor wafers.

The content of the above metal impurities can be measured by glow discharge mass spectrometry (GD-MS method).

The silicon carbide having a low content of such metal impurities, can be produced, for example, by using high purity carbon having a purity of 99.99%, treated for purification by a halogen gas, as the substrate to form silicon carbide.

Now, Examples (Examples 1 to 6) of the present invention and Comparative Examples (Examples 7 and 8) will be described.

EXAMPLES 1 to 5

As a substrate, a disk having a diameter of 50 mm and a thickness of 5 mm and made of carbon having a purity of at most 99.99%, was prepared. This disk was placed in a reduced pressure CVD furnace and degasified to remove the gas contained in the disk under vacuum of $2.6\times10^{-6}$ atms. Then, the temperature was raised to 1,000° C. at a temperature raising rate of 15° C./min, then hydrogen gas was introduced to bring the pressure to 0.13 atm, and that state was maintained for 60 minutes to carry out cleaning treatment of e.g. dust.

Then, the temperature was raised at a temperature raising rate of 10° C./min to a film-forming temperature of 1,300°

C. Then, tetrachlorosilane and methane were introduced as starting material gases for forming a silicon carbide coating layer. By introducing hydrogen as a carrier gas, the above starting material gases were adjusted and supplied so that tetrachlorosilane, methane and hydrogen will be tetrachlorosilane:methane:hydrogen=15:15:70 by molar ratio. The pressure was adjusted to 0.13 atm. The system was maintained in this state for 5 hours to form a coating film of silicon carbide, followed by cooling to room temperature at a temperature lowering rate of 5° C./min. The thickness of the coating film of silicon carbide formed on the surface of the disk made of carbon was 3.0 mm, and the total of contents of Fe, Cu, Mg, Al, V, Ni, Na, K, Ca and Cr was 43 ppb.

The concentration of the metal impurities was measured by a GD-MS method by means of VG9000 (name of the apparatus of VG ELEMENTAL Company).

Then, the obtained disk made of carbon and having a coating film of silicon carbide formed, was processed, and the portion made of carbon was removed by cutting to obtain five shaped products of silicon carbide of 3 mm×1mm×40 mm. Such shaped products made of silicon carbide was put into a heating furnace and subjected to heat treatment for 6 hours in an argon atmosphere under a pressure of 1 atm at 1,600° C. (Example 1), 1,800° C. (Example 2), 2,000° C. (Example 3), 2,100° C. (Example 4) and 2,200° C. (Example 5). After the heat treatment, the shaped products were cooled to room temperature at a temperature lowering rate of 7° C./min.

EXAMPLE 6

A shaped product made of silicon carbide was prepared in the same manner as in Example 1. No heat treatment was carried out.

EXAMPLE 7

A shaped product made of silicon carbide was prepared in the same manner as in Example 1 except that at the time of forming the coating film of silicon carbide, the film-forming temperature was changed to 1425° C., and the pressure was changed to 0.007 atm. No heat treatment was carried out.

Evaluation results

Using the shaped products made of silicon carbide obtained in Examples 1 to 7, measurement of the resistivity, measurement of $I_{d1}/I_{d2}$ by powder X-ray diffraction and evaluation of acid resistance, were carried out.

With respect to five shaped products made of silicon carbide, the resistivity was measured by a potentiometer method by means of a four terminal resistor. The measured resistivity (average value of the measured values of the five shaped products) and the width of fluctuations of the resistivity ((maximum value-minimum value)×100/( average value of the measured values of the five shaped products)) were calculated.

As a powder X-ray diffraction apparatus, GEIGERFLEX RAD-IIA, manufactured by Rigaku Denki KK., was employed, and $I_{d1}$ and $I_{d2}$ were measured, whereupon $I_{d1}/I_{d2}$ was calculated. Here, $I_{d1}$ and $I_{d2}$ are peak intensities obtained by carrying out the above mentioned smoothing treatment and the background removal. As the X-ray source, CuKα-ray was used, and with respect to the accelerating voltage and the accelerating current of the X-ray tube, the divergence slit, the receiving slit and the scattering slit, the above mentioned conditions were employed for the measurements. The sample used was one obtained by pulverizing a shaped product made of silicon carbide to a particle diameter of at most 10 μm. The results of the foregoing measurements are shown in Table 1.

Further, the shaped product made of silicon carbide was immersed in an aqueous solution containing 10 wt % of hydrofluoric acid and 15 wt % of nitric acid for 24 hours and then dried, whereby the weight of the shaped product before and after the immersion was measured. With each shaped product, no weight change was observed.

TABLE 1

|  | Resistivity ×10³ Ω·cm | Width of fluctuations ± % | $I_{d1}/I_{d2}$ |
|---|---|---|---|
| Example 1 | 1.00 | 5 | 0.02 |
| Example 2 | 3.25 | 7 | 0.04 |
| Example 3 | 4.50 | 9 | 0.2 |
| Example 4 | 120 | 6 | 0.25 |
| Example 5 | 2000 | 8 | 0.3 |
| Example 6 | 0.15 | 35 | Less than 0.005 |
| Example 7 | 34.0 | 40 | Less than 0.005 |

The silicon carbide of the present invention is one having the resistivity uniformly controlled in a high level range of from $10^3$ to $10^6$ Ω·cm and has high purity and high corrosion resistance. Accordingly, when used as a part for a plasma treatment apparatus, such as an electrostatic chuck, a heater, a protective ring, a sleeve or a chamber, it will scarcely contaminate semiconductor wafers and exhibits excellent durability against a plasma gas. Further, when the silicon carbide of the present invention is used as a protective ring, uniform etching of semiconductor wafers will be possible.

What is claimed is:

1. Silicon carbide having a resistivity of from $10^3$ to $10^6$ Ω·cm and a powder X-ray diffraction peak intensity ratio of at least 0.005 as represented by $I_{d1}/I_{d2}$ where $I_{d1}$ is the peak intensity in the vicinity of 2θ being 34° and $I_{d2}$ is the peak intensity in the vicinity of 2θ being 36°.

2. The silicon carbide according to claim 1, wherein the total content of metal impurities is not more than 50 ppb.

3. A process for producing the silicon carbide as defined in claim 1, which comprises forming β-type silicon carbide on a substrate by a CVD method, then removing the substrate, and heat-treating the obtained β-type silicon carbide at a temperature of from 1,500 to 2,300° C.

4. The process for producing the silicon carbide according to claim 3, wherein the temperature for the heat-treatment is from 1,800 to 2,000° C.

5. The process for producing the silicon carbide according to claim 3, wherein a cooling rate after the heat-treatment is from 2 to 20° C./min.

6. The process for producing the silicon carbide according to claim 3, wherein a cooling rate after the heat-treatment is from 5 to 10° C./min.

7. The process for producing the silicon carbide according to claim 3, wherein the heat-treatment is carried out in a non-oxidizing atmosphere at a pressure of from 0.1 to 2.0 atms.

8. The process for producing the silicon carbide according to claim 3, wherein the heat-treatment is carried out in a non-oxidizing atmosphere at a pressure of from 0.2 to 1.5 atms.

9. The process for producing the silicon carbide according to claim 3, wherein the silicon carbide is formed on the substrate by a CVD method in a non-oxidizing atmosphere at a temperature of from 1,000 to 1,400° C.

10. The process for producing the silicon carbide according to claim 3, wherein the silicon carbide is formed on the substrate by a CVD method in a non-oxidizing atmosphere at a temperature of from 1,200 to 1,350° C.

11. The silicon carbide according to claim 1, wherein the ratio of $I_{d1}/I_{d2}$ is from 0.005–0.5.

12. The silicon carbide according to claim 11, wherein the ratio of $I_{d1}/I_{d2}$ is from 0.007–0.2.

* * * * *